US011482851B2

(12) United States Patent
Zhou et al.

(10) Patent No.: US 11,482,851 B2
(45) Date of Patent: Oct. 25, 2022

(54) ARC FLASH MITIGATION DEVICE (71) Applicant: Eaton Intelligent Power Limited, Dublin (IE)

(72) Inventors: Xin Zhou, Wexford, PA (US); Brian E. Carlson, Gibsonia, PA (US); Brooke E. Lang, Pittsburgh, PA (US); Robert P. Griffin, Bradfordwoods, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/070,475

(22) Filed: Oct. 14, 2020

(65) Prior Publication Data
US 2022/0115857 A1  Apr. 14, 2022

(51) Int. Cl.
*H01J 3/14* (2006.01)
*H02H 1/00* (2006.01)
(Continued)

(52) U.S. Cl.
CPC ......... *H02H 1/0015* (2013.01); *G01R 31/333* (2013.01); *H01H 9/30* (2013.01);
(Continued)

(58) Field of Classification Search
CPC .. H01J 3/14; H01H 9/30; H01H 73/18; H01H 89/00; H01H 33/59; H01H 9/54;
(Continued)

(56) References Cited

U.S. PATENT DOCUMENTS 6,104,106 A * 8/2000 Partridge ............... H03K 17/16
307/126
7,570,465 B2  8/2009 Beatty, Jr. et al.
(Continued)

FOREIGN PATENT DOCUMENTS

CN  104871285 B  1/2018
CN  104604055 B  6/2019
(Continued)

OTHER PUBLICATIONS

"Arcflash Reduction Maintenance System," Eaton, Publication No. SA00804001E / Z12812, Mar. 2013.
(Continued)

*Primary Examiner* — Danny Nguyen
(74) *Attorney, Agent, or Firm* — Eckert Seamans Cherin & Mellott, LLC (57) ABSTRACT

A device includes an electro-mechanical switching device having an open-circuit and closed-circuit conditions and a path of least resistance having a path input and a path output with the switching device between the input and the output. The device includes a bypass power switch device that comprises a solid-state circuit interrupter and that is configured to conduct current between the input and the output in response to an open-circuit condition of the switching device. The device includes a current sensor that is connected to the output and configured to detect a fault current event. The device includes an actuator that is coupled to the switching device and a controller that is configured to generate a trigger signal to activate the actuator to cause the open-circuit condition of the switching device and to interrupt the fault current event by the power switch device, based on the detected fault current event.

16 Claims, 8 Drawing Sheets

(51) Int. Cl.
*G01R 31/333* (2006.01)
*H02H 9/04* (2006.01)
*H01H 9/30* (2006.01)
*H01H 73/18* (2006.01)
*H02H 5/10* (2006.01)

(52) U.S. Cl.
CPC ............... *H01J 3/14* (2013.01); *H02H 9/041* (2013.01); *H01H 73/18* (2013.01); *H02H 5/10* (2013.01)

(58) Field of Classification Search
CPC .. H02H 5/10; H02H 3/38; H02H 3/00; H02H 3/087; H02H 9/02; H02H 1/0023; H02H 3/16; G01R 31/086; G01R 31/088
USPC .......................................................... 361/2–13
See application file for complete search history.

(56) References Cited

U.S. PATENT DOCUMENTS

| | | | |
|---|---|---|---|
| 7,646,575 B2 | 1/2010 | Weiher et al. | |
| 7,778,013 B2 | 8/2010 | Bruski et al. | |
| 7,791,846 B2 | 9/2010 | Roscoe et al. | |
| 8,040,517 B1 | 10/2011 | Wu et al. | |
| 8,054,594 B2 | 11/2011 | Wu et al. | |
| 8,228,652 B2 | 7/2012 | Yanniello | |
| 8,351,171 B2 | 1/2013 | Payack | |
| 8,492,672 B2 | 7/2013 | Shea | |
| 8,508,891 B2 | 8/2013 | Carlino et al. | |
| 8,837,103 B2 | 9/2014 | Weiher | |
| 8,861,144 B2 | 10/2014 | Shea et al. | |
| 9,178,353 B2 | 11/2015 | Robbins | |
| 9,240,682 B2 | 1/2016 | Sivakumar et al. | |
| 9,325,167 B2 | 4/2016 | Kumfer et al. | |
| 9,385,524 B2 | 7/2016 | Rowny, Jr. et al. | |
| 9,478,675 B2 | 10/2016 | Behrends et al. | |
| 9,502,188 B2 | 11/2016 | Devine | |
| 9,570,901 B2 | 2/2017 | Shea et al. | |
| 9,978,553 B2 | 5/2018 | Tomimbang et al. | |
| 10,020,643 B2 | 7/2018 | Zheng | |
| 10,096,993 B2 | 10/2018 | Taillefer et al. | |
| 10,098,270 B2 | 10/2018 | Bugaris et al. | |
| 10,320,176 B2 | 6/2019 | Bartonek et al. | |
| 10,483,749 B2 | 11/2019 | Rival et al. | |
| 10,553,382 B2 | 2/2020 | Lagree et al. | |
| 10,613,146 B2 | 4/2020 | Burns et al. | |
| 2007/0253124 A1* | 11/2007 | Zhou | H01H 33/022 361/2 |
| 2010/0254046 A1* | 10/2010 | Liu | H01H 9/542 361/8 |
| 2012/0105030 A1 | 5/2012 | Chen et al. | |
| 2012/0243137 A1 | 9/2012 | Lawler et al. | |
| 2013/0027829 A1* | 1/2013 | Antoniazzi | H02H 7/261 361/100 |
| 2014/0217996 A1 | 8/2014 | Peker et al. | |
| 2015/0280421 A1* | 10/2015 | Niwa | H02H 5/10 361/91.1 |
| 2016/0285259 A1 | 9/2016 | Shea et al. | |
| 2018/0145496 A1* | 5/2018 | Zeller | H02H 1/0023 |
| 2019/0044316 A1 | 2/2019 | Hrncir et al. | |
| 2019/0183733 A1 | 6/2019 | Ogimoto et al. | |
| 2019/0195949 A1 | 6/2019 | Burns et al. | |
| 2019/0348245 A1 | 11/2019 | Ricks | |
| 2019/0363532 A1 | 11/2019 | von zur Muehlen et al. | |
| 2019/0371561 A1 | 12/2019 | Ehrhardt et al. | |
| 2019/0372339 A1 | 12/2019 | Burns et al. | |
| 2020/0091711 A1 | 3/2020 | Shea et al. | |
| 2020/0106256 A1 | 4/2020 | Lawrence | |
| 2020/0211803 A1 | 7/2020 | Manahan et al. | |

FOREIGN PATENT DOCUMENTS

| | | |
|---|---|---|
| DE | 102017125310 A1 | 5/2019 |
| EP | 1709504 B1 | 3/2008 |
| EP | 2220666 B1 | 4/2012 |
| EP | 3 118 954 A1 | 1/2017 |
| EP | 2596517 B1 | 9/2018 |
| JP | 5890635 B2 | 3/2016 |
| KR | 100802312 B1 | 2/2008 |
| KR | 20190005954 A | 1/2019 |
| WO | 2007054811 A2 | 5/2007 |

OTHER PUBLICATIONS

European Patent Office, "International Search Report and Written Opinion" from corresponding International (PCT) application No. PCT/EP2021/025398, dated Jan. 14, 2022, 13 pp.

USPTO, "Non-Final Office Action", for corresponding U.S. Appl. No. 17/070,464, dated Apr. 27, 2022, 35 pp.

USPTO, "Notice of Allowance And Fee(s) Due", for corresponding U.S. Appl. No. 17/070,464, dated Aug. 11, 2022, 21 pp.

* cited by examiner

ARC FLASH MITIGATION DEVICE

BACKGROUND

The document describes devices, systems and methods that are directed to electrical power protection devices, systems and methods and, more particularly, to an arc flash mitigation device to protect maintenance personnel and electrical power equipment.

Arc flash events can cause significant damage to power distribution systems such as switchgear and panelboards, as well as personnel injuries. Circuit breakers and fuses can be used in switchgear to provide protection when there is a short circuit fault. However, current protection systems have a relatively long response time to interrupt propagating hazardous currents associated with a short circuit fault and eliminate arc flash events, especially when it is a fault caused by low level overcurrent.

It is desirable to have arc flash mitigation devices with even shorter response times to provide additional protection in the event of arc flash events.

SUMMARY

In some embodiments, a device includes an electro-mechanical switching device having an open-circuit condition and a closed-circuit condition and a path of least resistance having a path input and a path output with the electro-mechanical switching device between the path input and the path output. The device may also include a bypass power switch device that includes a solid-state circuit interrupter which is configured to conduct current between the path input and the path output, in response to an open-circuit condition of the electro-mechanical switching device. In the device, a current sensor is connected to the path output and configured to detect a fault current event. The device may include an actuator that is coupled to the electro-mechanical switching device and a controller. Based on the detected fault current event, the controller generates a trigger signal to activate the actuator to cause the open-circuit condition of the electro-mechanical switching device and to interrupt the fault current event by the bypass power switch device.

In various embodiments, the current sensor may have an output that is connected to a sensor input of the controller. The current sensor may be configured to communicate a signal representative of detection of the fault current event to the sensor input of the controller.

In various embodiments, the device may further include an external control panel connected to a control panel input of the controller. The external control panel may be configured to provide a user interface to control operations of the controller.

In various embodiments, the controller may also be configured to, in response to receiving a disarming control signal at the control panel input, cause in the path of least resistance the closed-circuit condition of the electro-mechanical switching device. The controller may also be configured to, in response to receiving an arming control signal at the control panel input, cause in the path of least resistance the open-circuit condition of the electro-mechanical switching device.

In various embodiments, the solid-state circuit interrupter may include at least one transient-voltage suppression (TVS) diode that has a first end connected to the path input and a second end connected to the path of least resistance between the electro-mechanical switching device and the path output. The solid-state circuit interrupter may also include a bi-directional transistor switch that has a first connection connected to the first end and the path input and a second connection connected to the second end and the path output.

In various embodiments, the at least one TVS diode comprises parallel TVS diodes.

In various embodiments, the device may further include a housing for housing the electro-mechanical switching device, the path of least resistance, the bypass power switch device and the controller. The housing may include a molded case circuit breaker or an air circuit breaker.

In various embodiments, the electro-mechanical switching device may include a vacuum interrupter. Additionally, the actuator may include a Thompson coil or piezo-electric actuator connected to the vacuum interrupter.

In various embodiments, the bypass power switch device also may include a cooling device.

In various embodiments, the detected fault current event may include a current associated with an arc flash event.

In various embodiments, a method may include controlling, in a path of least resistance including a path input and a path output and an electro-mechanical switching device that is between the path input and the path output. The method may include detecting, by a current sensor, a fault current event at the path output and generating, by a controller, a trigger signal to activate an actuator coupled to the electro-mechanical switching device. In response to the activation of the actuator, the method may include causing an open-circuit condition of the electro-mechanical switching device in the path of least resistance. In response to the open-circuit condition, the method includes interrupting the detected fault current event by a bypass power switch device that comprises a solid-state circuit interrupter connected to the path input and the path output.

In various embodiments, the method may include controlling, by an external control panel connected to a control panel input of the controller, operations of the controller.

In various embodiments, the controlling, by the controller, may include, in response to a disarming control signal received at the control panel input of the controller, causing a closed-circuit condition of the electro-mechanical switching device from the path input to the path output. Also the controlling, by the controller, may include, in response to an arming control signal received at the control panel input of the controller, causing the open-circuit condition of the electro-mechanical switching device.

In various embodiments, the interrupting by the bypass power switch device may include passing the fault current event to at least one transient-voltage suppression (TVS) diode of the solid-state circuit interrupter connected to the path of least resistance between the electro-mechanical switching device and the path output, to suppress a transient voltage.

In various embodiments, the bypass power switch device may include a cooling device. The method may further include cooling the bypass power switch device by the cooling device.

In various embodiments, the bypass power switch device has a response time between 100 microseconds and 0.5 milliseconds to interrupt the detected fault current event.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. For example, devices are "electrically connected" if a conductive path exists between the devices, even if the path includes one or more intermediate components. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 1:
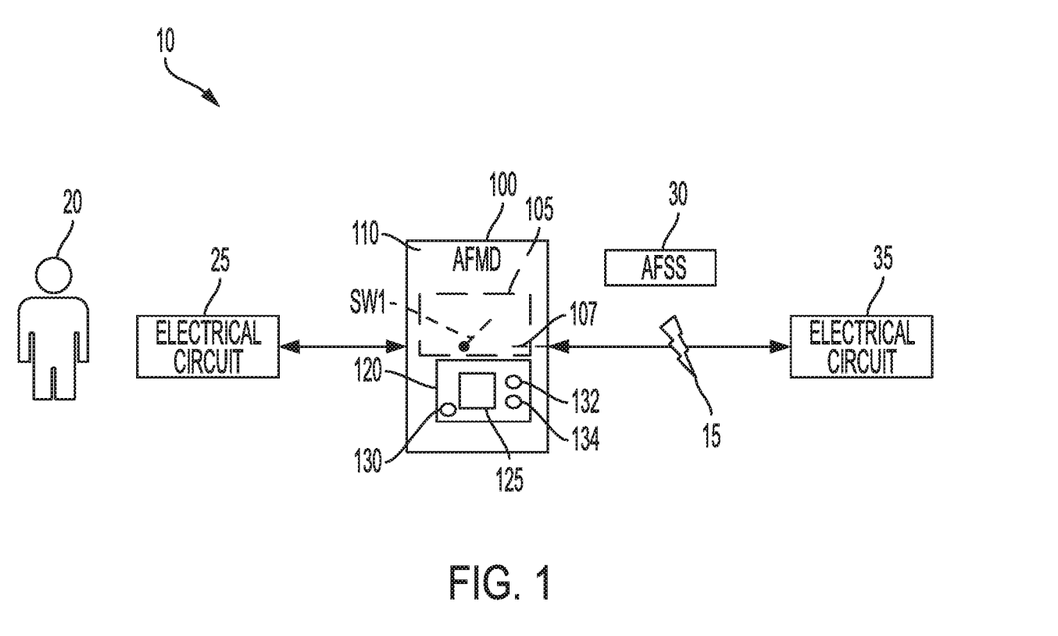
FIG. 1 illustrates a block diagram of a system employing an arc flash mitigation device.

FIG. 1 illustrates a block diagram of a system 10 employing an arc flash mitigation device (AFMD) 100. Arc flash mitigation device 100 may include a housing 110 with a control panel 120. Control panel 120 may include a display panel 125 and an indicator 130. Indicator 130 may include a light indicator including a light emitting diode (LED), another type of light, or some other type of indicator device. By way of non-limiting example, activating arc flash mitigation device 100 may cause the light indicator 130 to illuminate. The light indicator 130 may allow personnel 20 to determine that arc flash mitigation device 100 is armed or "ON."

Display panel 125 may include a liquid crystal display (LCD) or LED display. Display panel 125 may include a touch sensitive user interface for receiving user input. Control panel 120 may include control buttons 132 and 134 such as for arming, disarming and/or resetting, respectively, arc flash mitigation device 100. One or more components of arc flash mitigation device 100 may include a solid-state design. The details of arc flash mitigation device 100 will be described in more detail in relation to FIGS. 2A-2B and 3.

Housing 110 houses protection electronic circuitry 105 of arc flash mitigation device 100, denoted in FIG. 1 as a dashed box. Protection electronic circuitry 105 may include a path of least resistance 107. In FIG. 1, path of least resistance 107 includes an electro-mechanical switch SW1, which will be described in more detail in relation to FIGS. 2A-2B. In FIG. 1, switch SW1 is "OPEN" forming an open-circuit condition within protection electronic circuitry 105 along the path of least resistance 107 when arc flash mitigation device 100 is activated or armed.

The system 10 may include an electrical circuit 35 that from time to time requires maintenance by personnel 20. Electrical circuit 35 may be a sub-component of an electrical power machine or an element of electrical distribution equipment. For example, the machine or equipment may include switchgear, a switchboard or a panelboard. Electrical circuit 35 may include an electrical power circuit. Personnel 20 may be required to connect an electrical circuit 25, such as an electrical tester or other device electrically to the electrical circuit 35 to perform a test or the other maintenance action. The electrical circuit 25 may generate an electrical current representative of a test signal. The electrical circuit 25 may expect a response or return signal from electrical circuit 35. As will be described in more detail below, arc flash mitigation device 100 when activated is configured to protect personnel 20.

In various embodiments, the system 10 may include an arc flash sensor system (AFSS) 30 that is configured to sense an arc flash event downstream of the arc flash mitigation device 100 such as a flash of light 15 or a current representative of an arc flash. Arc flash sensor system 30 may include a vision system with one or more optical sensors, such as cameras or other image capture devices that can detect a flash of light 15. However, for the purposes of discussion, arc flash sensor system 30 is separate from arc flash mitigation device 100 and may be used to protect other equipment including electrical circuit 35. Arc flash sensor system 30 may include current sensors of an Arcflash Reduction Maintenance System™ (ARMS) by Eaton® Corporation, or other suitable current sensors.

Housing 110 may include a form factor substantially similar to that of a circuit breaker, as will be described later in relation to FIGS. 4A-4C. Housing 110 may have a molded case. Packaging for arc flash mitigation device 100 in such a housing may find particularly advantageous application in providing arc fault mitigation in an electrical panelboard or other equipment at a location suited for installation of a standard form factor breaker. However, it should be understood, that the embodiments are not limited to such a form factor.

Figure 2A:
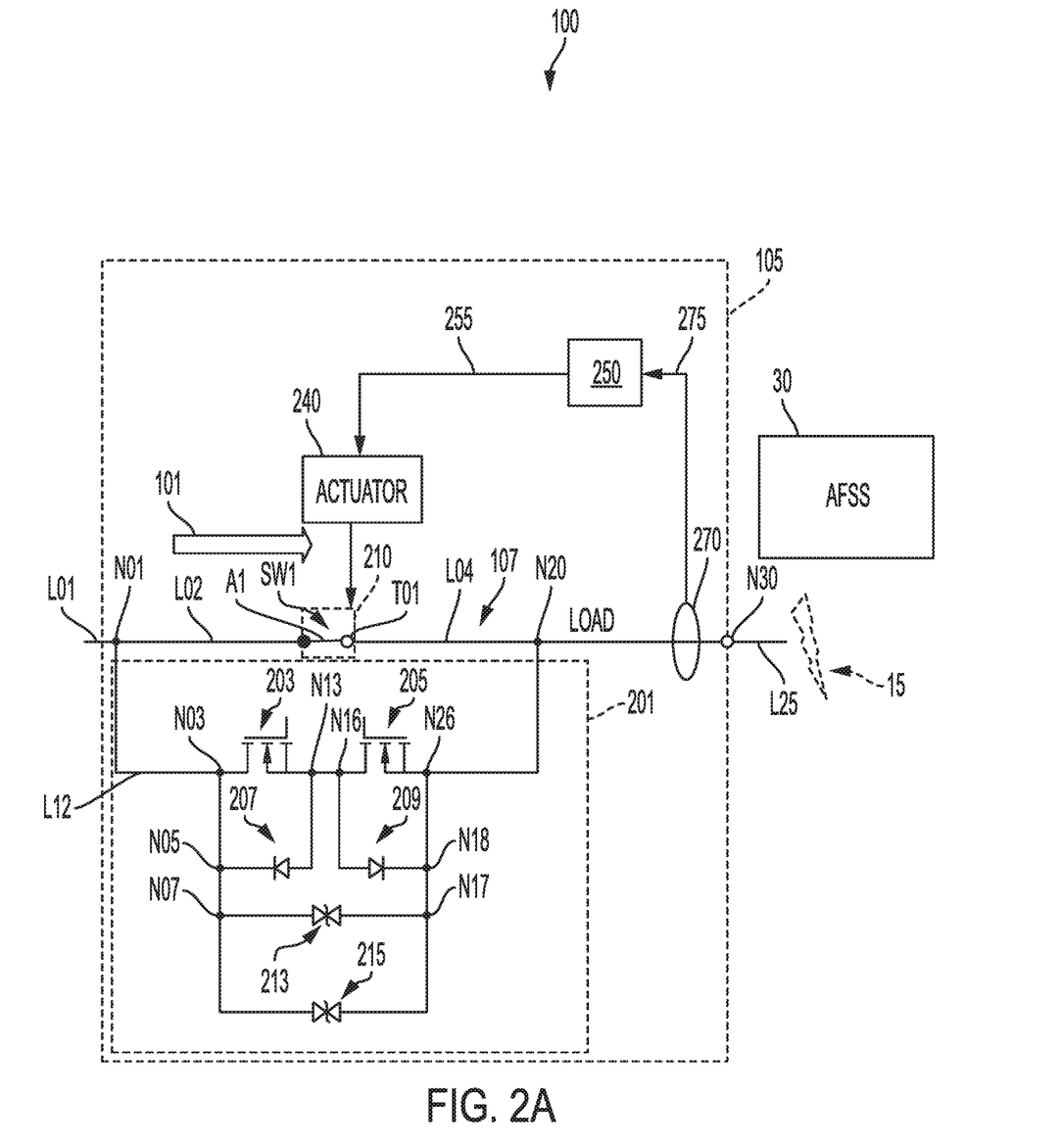
FIG. 2A illustrates a schematic diagram of an arc flash mitigation device in a first mode of operation according to some embodiments.
Figure 2B:
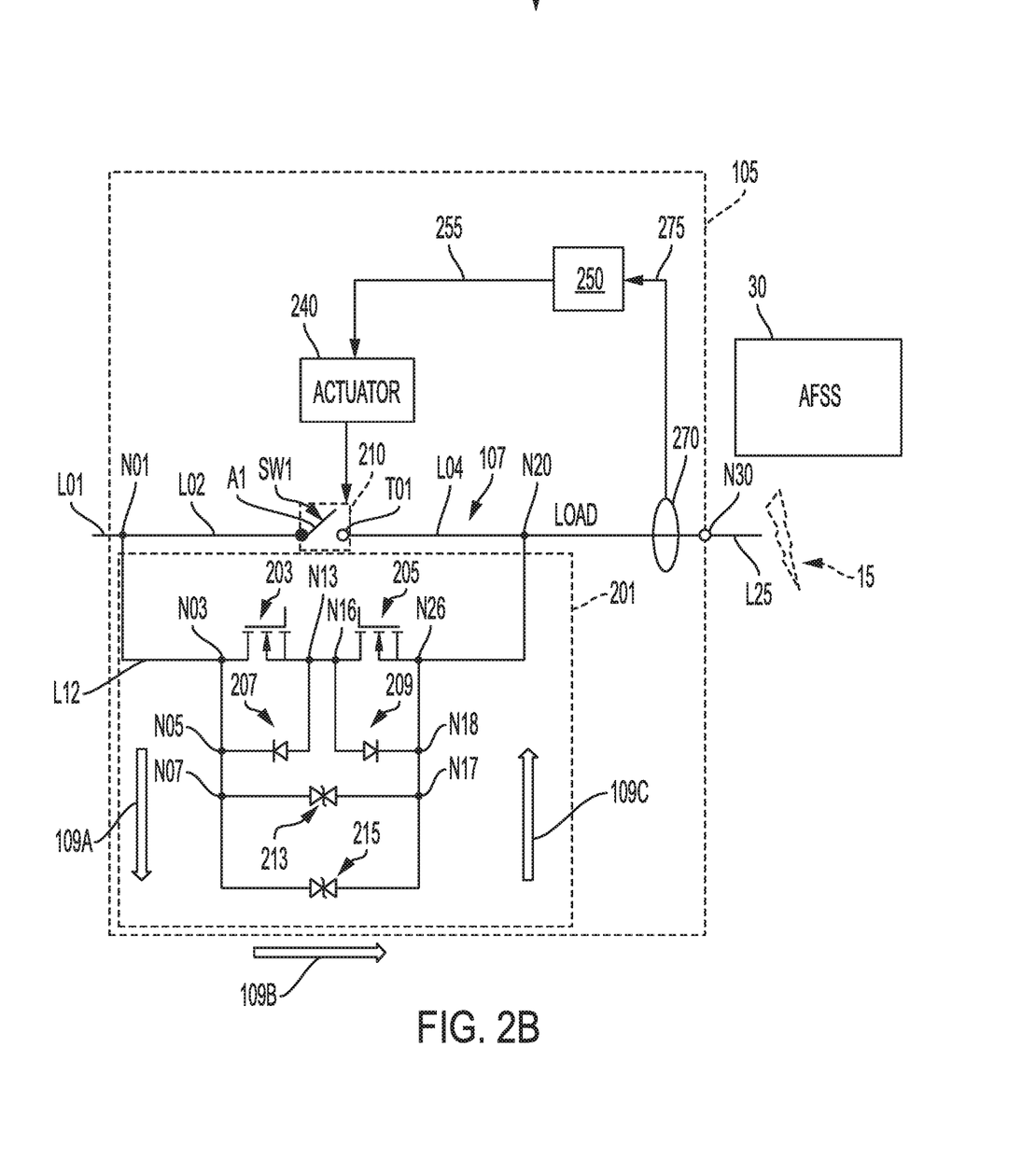
FIG. 2B illustrates a schematic diagram of the arc flash mitigation device in a second mode of operation in according to some embodiments.

FIG. 2A illustrates a schematic diagram of arc flash mitigation device 100 in a first mode of operation according to some embodiments. The first mode corresponds to a disarmed mode or normal mode of operation of protection electronic circuitry 105 with electro-mechanical switch SW1 "CLOSED" or in a closed-circuit condition. Switch SW1 is configured to have a lower on-resistance along the path of least resistance 107. FIG. 2B illustrates a schematic diagram of arc flash mitigation device 100 in a second mode of operation in according to some embodiments. The second mode corresponds to an armed mode or an arc flash reduction maintenance mode of protection electronic circuitry 105 with electro-mechanical switch SW1 "OPEN" or in an open-circuit condition, such that an open-circuit is formed along the path of least resistance 107; and an alternate bi-directional bypass path through an electronic bi-directional bypass power switch device 201 to vacuum interrupter 310 of the electro-mechanical switching device 210 is created. The electro-mechanical switching device 210 is described in more detail in relation to FIG. 3. The path of least resistance 107 when switch SW1 is "CLOSED" may be bi-directional.

FIGS. 2A and 2B illustrate the same arc flash mitigation device 100 in different modes of operation, hence like reference numerals are used in these figures.

Bi-directional bypass power switch device 201 may include a solid-state circuit interrupter to interrupt a fault current of a fault event. A fault event may be one of a high-current event or a current representative of an arc flash event. In particular, bypass power switch device 201 is electrically connected to a controller 250. The controller 250 may send a trigger signal on trigger conductor 255 to activate an ultra-fast actuator 240 connected to the electro-mechanical switching device 210, in response to an arc flash event or high current, to cause the switch SW1 to "OPEN." Ultra-fast actuator 240 will be ultra-fast in that is capable of acting more quickly than branch breakers and/or a main breaker of a system. For example, the switch SW1 may include contacts 313 and 323 (FIG. 3) of the electro-mechanical switching device 210 that will be forced to separate (open) to at least 1 millimeter (mm) distance within a few hundred microseconds (μs) driven by the ultra-fast actuator 240, as will be described in more detail in relation to FIG. 3.

The controller 250 may be responsive to a fault signal (i.e., high current) from current sensor 270 in-line of the path of least resistance 107 between switch SW1 and output node N30. The current sensor 270 senses current on line L25, for example, flowing to node N30. The term "node" as used herein may refer to a connection or a connection location.

Responsive to detection of a current level representative of an occurrence of a fault event such as a high-current event or a current associated with an arc flash event, controller 250 generates the trigger signal on trigger conductor 255 to trigger the ultra-fast actuator 240. The arc flash event corresponds to the presence of an arc flash light 15. The current sensor 270 may detect current along the path of least resistance 107 or upstream of the arc flash mitigation device 100 and be triggered by a current level that exceeds a threshold that corresponds to a high risk to maintenance personnel or equipment. Using signals from the current sensor 270 and the optical sensors, it may take about 2 ms to detect and confirm via the arc flash sensor system 30 and controller 250 the arc flash event, which will send a trigger signal to the electro-mechanical switching device 210. Within approximately 2.5 ms, the fault current of the fault event can be interrupted by the arc flash mitigation device 100.

Circuit breakers, sometimes referred to as circuit interrupters, include electrical contacts that connect to each other to pass current from a source to a load. The contacts may be separated by force in order to interrupt the delivery of current, either in response to a command or to protect electrical systems from electrical fault conditions such as current overloads, short circuits, and high or low voltage conditions. In some embodiments, electro-mechanical switching device 210 may be coupled to an ultra-fast actuator 240 that creates a force to separate the contacts 313 and 323, as will be described in relation to FIG. 3. An ultra-fast actuator 240 (FIG. 3) will be configured to open the switch SW1 to achieve at least 1 millimeter (mm) contact gap between the contacts 313 and 323 within a response time within 0.5 ms. Electro-mechanical switching device 210 will be described in more detail in relation to FIG. 3.

As a point of reference, assume that node N01 on the path of least resistance 107 is an input node that is configured to receive an electrical current from an external electrical circuit 25, for example. The path of least resistance 107 may begin with node N01. Hence, node N01 may also be referred to as an "input" or "path input." The electrical current at node N01 may propagate along line L02 and to electro-mechanical switching device 210 with a switch SW1. As the electrical current propagates through switch SW1, the electrical current propagates along line L04 to node N20, for example. Switch SW1 includes an output terminal T01. In the closed-circuit condition, representative switching arm A1 of switch SW1 is oriented so that an electrical current flowing on line L02 passes through switch SW1 to line L04 also part of the path of least resistance 107. The switch arm A1 is for illustrative purposes and not meant to limit the configuration or operation of the switch SW1 in any way. The path of least resistance 107 continues from node N20 to the output at node N30. Node N20 may provide a bypass path from node N01 on an input side of switch SW1 to an output side of switch SW1 corresponding to node N20 in the path of output terminal T01. The output side of switch SW1 corresponds to output terminal T01 positioned in-line with the path of least resistance 107.

The electronic bi-directional bypass power switch device 201, denoted in a dashed box positioned below the path of least resistance 107, is configured to interrupt the fault current of the fault event, such as from an arc flash event. From node N01, the electrical current may propagate in the direction of arrow 109A to bi-directional bypass power switch device 201 along line L12 to node N03, such as when switch SW1 is "OPEN." Alternately, the electrical current on line L12 may propagate to a switch 203 of the bi-directional bypass power switch device 201 in the direction of arrow 109B. Switch 203 may include a transistor such as a Metal Oxide Field Effect Transistor (MOSFET). The drain side of switch 203 may be connected to node N03. The source side of the switch 203 may be connected to node N13 where a first side of a diode 207 is connected to node N13 or the source side of the switch 203. The drain side of the switch 203 may be connected to a second side of diode 207 via node N05. In the illustration, the drain side of switch 203 is connected to the cathode of the diode 207; and the source side of the switch 203 is connected to the anode of diode 207. While the description herein uses MOSFET devices, other semiconductor transistor switch configurations may be used.

The source side of switch 203 may be electrically connected to a source side of switch 205 via node N16 in series with node N13. Switch 205 may include a transistor such as a Metal Oxide Field Effect Transistor (MOSFET). The drain side of switch 205 may be electrically connected to node N26 that propagates a signal in the direction of arrow 109C to node N20 on the path of least resistance 107. The MOSFET (transistor) switches 203 and 205 may form a bi-directional switch. The source side of switch 205 may be electrically connected to node N16 where a first side of a diode 209 is electrically connected to node N16 or the source side of switch 205. The drain side of the switch 205 may be electrically connected to a second side of diode 209 via node N18. In the illustration, the drain side of switch 205 is electrically connected to the cathode of diode 209; and the source side of switch 205 is electrically connected to the anode of diode 209. Since bypass power switch device 201 is bi-directional, the current may flow in the reverse direction such as from node N20 through arrows 109C, 109B and 109A to node N01, such as when switch SW1 is "OPEN."

Bi-directional bypass power switch device 201 may include a first transient-voltage suppression (TVS) diode 213 having one side connected to node N07 and a second side connected to node N17. Node N17 is electrically connected to node N18. Bi-directional bypass power switch device 201 may include a second transient-voltage suppression (TVS) diode 215 also having one side connected to node N07 and a second side connected to node N17. Diodes 213 and 215 may be parallel.

Current sensor 270 is downstream of switch SW1 in proximity to the node N30, which is sometimes referred to as the "output" or "path output." Current sensor 270 is configured to sense an amount of current on line L25. Current sensor 270 is in electronic communication with or electrically connected to controller 250 and may deliver a sensed current signal on line 275 representative of a measure of electric current on line L25. In other variations, the sensed current signal may produce a fault detection signal, which is communicated to the controller 250 when the sensed signal is at a predefined current threshold to cause injury to personnel 20.

Figure 3:
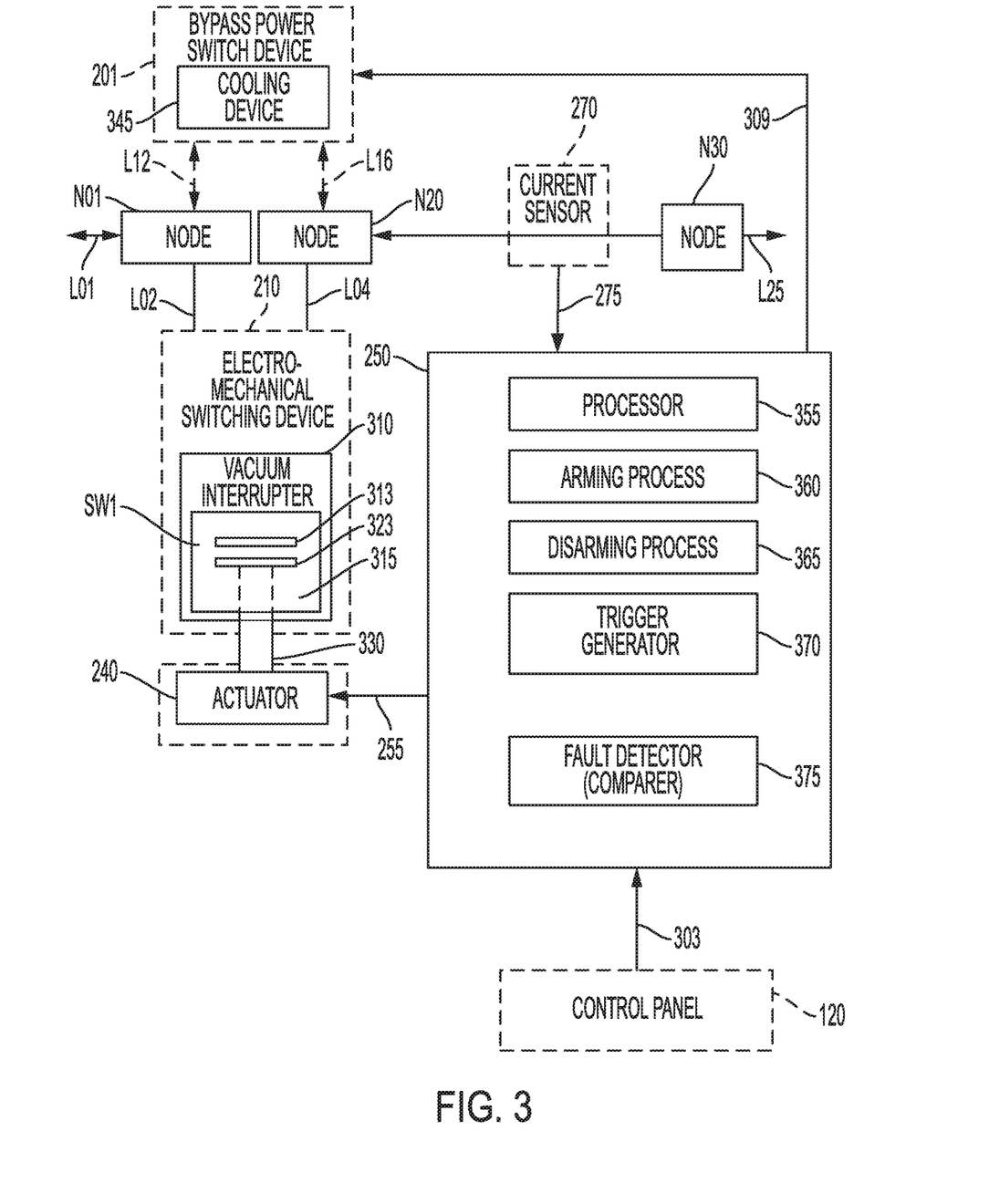
FIG. 3 illustrates a block diagram of a controller of the arc flash mitigation device of FIGS. 2A-2B interfaced with components of the device.

FIG. 3 illustrates a block diagram of a controller 250 of the arc flash mitigation device 100 of FIGS. 2A-2B interfaced with components of the device. Controller 250 is in electrical communication or connected with control panel 120 to receive a first control signal on line 303. For example, personnel 20 may place arc flash mitigation device 100 in the normal mode of operation in response to the first control signal generated by control panel 120. The normal mode of operation corresponds to the arc flash reduction maintenance mode being "OFF," thus the controller 250 sets the switch SW1 to the closed-circuit condition. Controller 250 is responsive to control buttons 132 and 134 such as for arming and disarming, respectively, the arc flash mitigation device 100. Arming the arc flash mitigation device 100 turns "ON" the arc flash reduction maintenance mode such that the switch SW1 is set in the open-circuit condition.

Control panel 120 may generate the first control signal on line 303 to cause controller 250 to control the operational mode of device 100. The line 303 may be connected to a control panel input or port of controller 250. The signals received on the control panel input or port of controller 250 controls the operation (arm process or disarm process) of the controller. Thus, the control panel may generate disarming control signal to disarm device 100 and an arming control signal to arm arc flash mitigation device 100. Controller 250 may be powered although device 100 is disarmed, as the disarmed mode generally changes the condition of the switch SW1.

Specifically, for the normal mode of operation, the controller 250 may cause switch SW1 to transition to the closed-circuit condition as shown in FIG. 2A, represented as switch arm A1 connected to output terminal T01. Accordingly, the path of least resistance 107 extends from node N01 to node N30 without an open-circuit condition. Controller 250 may send control signals in some embodiments on control line 309 to control bypass power switch device 201 to switch to "OFF." Furthermore, controller 250 may control active cooling device 345 of the bypass power switch device 201, if present. Control panel 120 may generate a second control signal on line 303 to cause controller 250 to control the operational mode of device 100 to cause switch SW1 to "OPEN," as best seen in FIG. 2B, such that device 100 becomes armed. In other words, the switch SW1 has an open-circuit condition represented as switch arm A1 being lifted in a direction away from terminal T01.

Controller 250 may include at least one processor 355. Hardware details of controller 250 will be described in more detail in relation to FIG. 8. Controller 250 may also include hardware, software and/or firmware for performing an arming process 360 and a disarming process 365. The disarming process 365 configures arc flash mitigation device 100 to operate according to the normal mode of operation, as shown in FIG. 2A and described above. For example, the disarming process 365 may cause controller 250 to control switch SW1 to "CLOSE" or transition to a closed-circuit condition in response to the control signal on line 303.

The disarming process may cause the arc flash reduction maintenance mode to be switched "OFF." Additionally, switch SW1 may be set to be in a "CLOSE" position and the bypass power switch device 201 can be either in an "OFF" state or in an "ON" state. In various embodiments, the bypass power switch device 201 may remain in an "ON" state when the arc flash reduction maintenance mode is "OFF."

Arming process 360 may cause controller 250 to control switch SW1 to "OPEN" or transition to an open-circuit condition relative to the path of least resistance 107 in response to a second control signal on line 303. Switch SW1 when "OPEN" relative to the path of least resistance 107, is represented as switch arm A1 lifted away from contact output terminal T01. Switch SW1 has a low on-resistance. Arming process 360 may also cause controller 250 to set or reset ultra-fast actuator 240 and may cause the arc flash reduction maintenance mode to be turned "ON." In some embodiments, the arming process 360 may engage switch SW1 which may be part of a vacuum interrupter 310, in some embodiments, to cause contacts 313 and 323 to separate from each other or open the switch SW1. The vacuum interrupter 310 may include a vacuum chamber 315 such as in a ceramic bottle, where an arc is drawn by separating contacts 313 and 323 while carrying current.

When actuator 240 is reset, linkage 330 and actuator 240 are configured to maintain contacts 313 and 323 electrically open. Device 100 is also capable of reuse under control of controller 250 after an arc flash event is detected and cleared.

Electro-mechanical switching device 210 when "OPEN" allows the fault current of the fault event to commutate to the bypass power switch device 201 in the current path of the electric circuit 35 downstream. The current commutation can happen either by using a high frequency electronic oscillation circuit (not shown) or by an arc voltage across the contact gap between contacts 313 and 323 when the contacts 313 and 323 separate while carrying current. The fault event or fault current is fully commutated to the power electronic current path through bypass power switch device 201 within tens of microseconds. The contacts 313 and 323 are forced to reach the minimum contact gap to withstand a transient recovery voltage (TRV). Thus, the fault current will be interrupted by bypass power switch device 201 and stop or eliminate the arc flash event or fault current event. All this (e.g., opening the switch SW1 and interrupting the fault current of the fault event by the bypass power switch device 201) is configured to happen within about 0.5 ms or less. In other words, the response time is approximately 0.5 ms or less.

Controller 250 may also include a trigger generator 370 and a comparer 375, which may include hardware, software and/or firmware. While arc flash mitigation device 100 is armed, comparer 375 may compare the signal received from the sensor 270. The signal on line 275 may be connected to a sensor input or port of controller 250. Depending on the results of the comparison, trigger generator 370 may generate a trigger signal propagated along trigger conductor 255 to electro-mechanical switching device 210. Specifically, the trigger signal may be communicated to ultra-fast actuator 240 to activate the actuator to cause the vacuum interrupter 310 to "OPEN" such that the electrical contacts 313 and 323 are forced open by linkage 330. In FIG. 3, the contact 313 and 323 are shown as open.

In various embodiments, when the switch SW1 is "CLOSED" and the bypass power switch device 201 is in the "ON" state, for example, controller 250, although disarmed from the arc flash reduction maintenance mode, is still operational to trigger the actuator 240 to cause switch SW1 to "OPEN," in response to a fault event detected by fault detector (comparer) 375. Accordingly, when switch SW1 is "OPEN," the current of the fault event is commutated to the bypass power switch device 201 so that the fault event may be interrupted by the bypass power switch device 201.

In some scenarios, the signal received by controller 250 from sensor 270 may be a fault signal representative of an arc flash event. The sensor 270 may send a measurement signal representative of the arc flash event or alternately a high-current event. A high-current event is associated with a high current that may be less than the current associated with an arc flash event. The fault signal and measurement signal may be configured to represent an overcurrent or overvoltage condition due to the detected one of the arc flash event and/or the high-current event by the sensor 270. In some embodiments, comparer 375 of controller 250 may compare the measurement signal with a threshold to detect the occurrence of the arc flash event. In either scenario, comparer 375 may provide a control signal to the trigger generator 370 to cause a trigger signal to be generated.

In some embodiments, ultra-fast actuator 240 may include a Thompson coil actuator connected to linkage 330. The actuator 240 may be a piezo-electric actuator or other ultra-fast actuator. In operation, ultra-fast actuator 240 may receive a control (trigger) signal from controller 250 to cause the actuator 240 to activate. Actuator 240 when activated produces a fast acting force to be applied on linkage 330 that in turn makes contacts 313 and 323 of switch SW1 in vacuum interrupter 310 to separate.

Bypass power switch device 201 may have a cooling device 345 that is configured to perform passive cooling or active cooling. In embodiments where the cooling device 345 performs active cooling, fans may be used for cooling. For passive cooling, the cooling device 345 may include a heat sink. When fans are used and the arc flash mitigation device 100 is armed or when the bypass power switch device 201 is set to "ON," the active cooling devices are also turned "ON," as well. Controller 250 may provide additional control signals to electro-mechanical switching device 210 and bypass power switch device 201.

If implemented in software, the functions of controller 250 may be stored as one or more instructions or code on a computer-readable medium and executed by a hardware-based processing unit. Computer-readable media corresponds to a tangible medium such as data storage media (e.g., RAM, ROM, EEPROM, flash memory, or any other medium that can be used to store desired program code in the form of instructions or data structures and that can be accessed by a computer).

Instructions may be executed by one or more processors 355, such as one or more digital signal processors (DSPs), general-purpose microprocessors, application specific integrated circuits (ASICs), field programmable logic arrays (FPGAs), or other equivalent integrated or discrete logic circuitry. Accordingly, the term "processor" as used herein may refer to any of the foregoing structure or any other physical structure suitable for implementation of the described techniques. In addition, the techniques could be fully implemented in one or more circuits or logic elements.

Specifically, path of least resistance 107 has a first resistance. Switch SW1 has a low on-resistance Switch SW1 has a closed position to output terminal T01. A path of least resistance 107 has an input (i.e., node N01) and an output (i.e., node N30) with switch SW1 between the input (i.e., node N01) and output (i.e., node N30). Electro-mechanical switching device 210 has an open-circuit condition when the switch SW1 is in an open position. The bi-directional bypass power switch device 201 is electrically connected to the path of least resistance 107 at a first location associated with the input (i.e., node N01) and at a second location between the switch SW1 and the output (i.e., node N30).

When the bi-directional bypass power switch device 201 is "ON" and switch SW1 is "OPEN," the bypass power switch device 201 is configured to carry an electrical current originating at node N01 or the input to node N30 or the output. The bi-directional bypass power switch device 201 is also configured to conduct an electrical current originating at node N30 or the output to node N01 or the input. In the scenario that a fault event is experienced when the arc flash reduction maintenance mode is "ON," bi-directional bypass power switch device 201 protects maintenance personnel by interrupting the fault current of the fault event including an arc flash event. In particular, parallel transient-voltage suppression (TVS) diodes 213 and 215 may be configured to limit transient overvoltage level. Alternately, any current from line L25 to node N20 may go through bi-directional bypass power switch device 201.

When bi-directional bypass power switch device 201 is "ON" and switch SW1 is "CLOSED," controller 250 is configured to, in response to receiving a signal representative of a fault event, generate a trigger signal to actuator 240 to interrupt a fault current of an arc flash event or high-current fault event by opening switch SW1. Thus, the fault current of the fault event is interrupted by bypassing a portion of the path of least resistance and channeling the fault current at node N20 to bi-directional bypass power switch device 201. Again, any current from line L25 to node N20 may be propagated through bi-directional bypass power switch device 201 and interrupted so that the fault event is stopped.

If the arc flash reduction maintenance mode is turned on in which switch SW1 is already "OPEN", for example, then when the fault current reaches 2× or 2.5× the rated current, the bi-directional power electronic switch 201 will interrupt the fault current within 100 µs. The arc flash energy is associated with the arc flash event and may be described as the fault current multiplied by the arc voltage.

The solid-state design can be packaged into the same form factor as a molded case circuit breaker (MCCB) or an air circuit breaker (ACB) so that it retrofit in existing switchgear, switchboard or panelboard, for example, as will be discussed in relation to FIGS. 4A-4C, 6A-6B and 7.

Figure 4A:
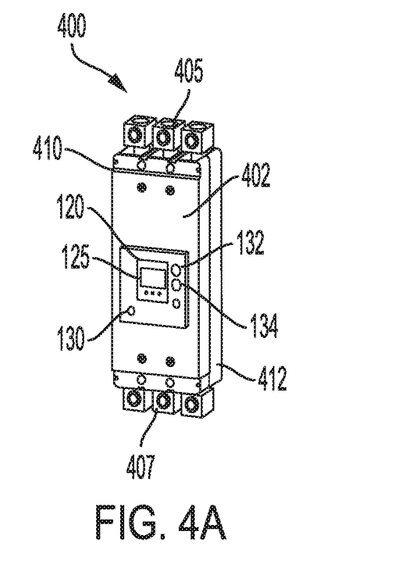
FIG. 4A illustrates a front perspective view of an arc flash mitigation device with a housing with a molded case circuit breaker (MCCB) form factor.
Figure 4B:
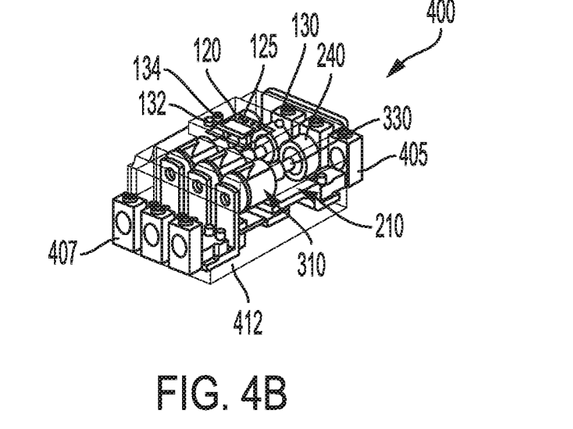
FIG. 4B illustrates an end and side perspective view of the arc flash mitigation device of FIG. 4A with a portion of the housing removed.
Figure 4C:
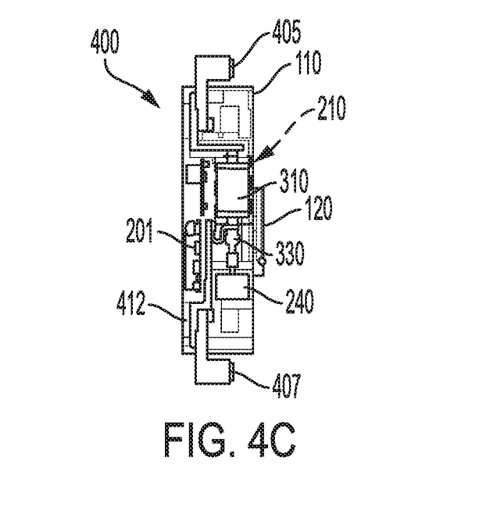
FIG. 4C illustrates a side view of the arc flash mitigation device of FIG. 4A with a portion of the housing removed.

FIG. 4A illustrates a front perspective view of an arc flash mitigation device 400 with a housing with a MCCB form factor. Arc flash mitigation device 400 is the same as arc flash mitigation device 100 except details of the form factor of housing 410 will be described. Housing 410 may include upper connectors 405 and lower connectors 407 for attaching cables or bus bars to conduct current from line side to load side electrical equipment, for example, or other electrical machine. A front panel or cover 402 of the housing 410 may have display panel 125, indicator 130 and control buttons 132 and 134 for easy access by personnel 20 (FIG. 1). However, it should be understood that control panel 120 may include other control buttons not described. FIG. 4B illustrates an end and side perspective view of the arc flash mitigation device 400 of FIG. 4A with a portion of the housing removed. FIG. 4C illustrates a side view of the arc flash mitigation device 400 of FIG. 4A with a portion of the housing removed. A back panel 412 may be mated and attached to a panel inside of switchgear 500 (FIG. 5) Housing 410 may locate bi-directional bypass power switch device 201 of protection electronic circuitry 105 adjacent a back panel 412 of housing 410. Electro-mechanical switching device 210 may include a vacuum interrupter 310. The ultra-fast actuator 240 is mechanically coupled to the vacuum interrupter 310 via a linkage 330. Electro-mechanical switching device 210 may have one end coupled to a top end of housing 410. Arc flash mitigation device 400 may include a plurality of electro-mechanical switching devices 210 arranged in parallel for different poles. Each electro-mechanical switching device 210 is connected to its own actuator 240 via a linkage 330.

Figure 5:
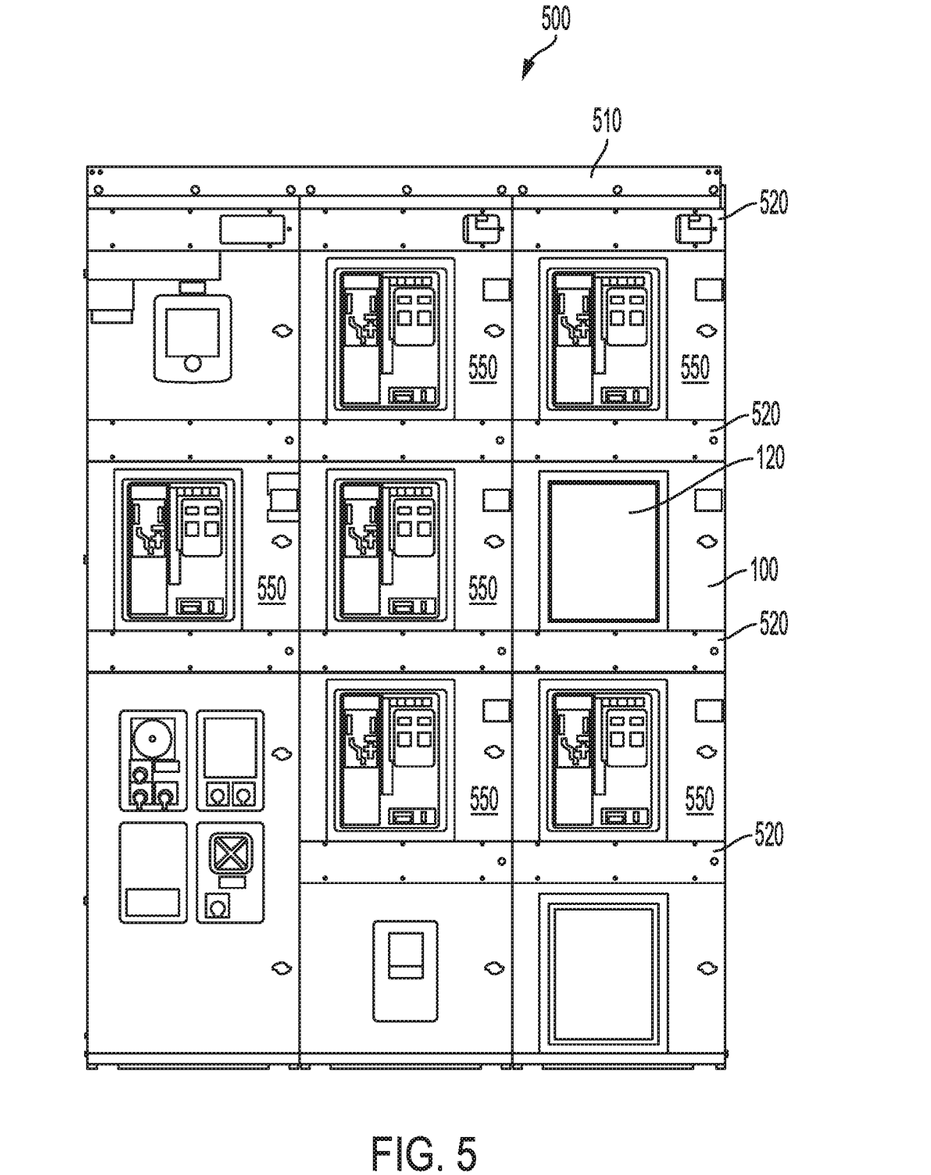
FIG. 5 illustrates in an electrical panelboard.

FIG. 5 illustrates an example electrical switchgear 500 to which an arc mitigation device may be installed according to some embodiments. A switchgear 500 may be configured to receive a standard form circuit breaker. The switchgear 500 includes a housing 510 for housing a bus backplane assembly 520 mounted to the housing 510. The bus backplane assembly 520 may be configured to receive a circuit breaker, which may be electrically connected to buses of the bus backplane assembly 520 and arc flash mitigation device 100 housed in a housing with a compatible form factor and includes control panel 120.

Housing 510 may include cutouts sized to expose a front face of circuit breakers 550 installed in the bus backplane assembly 520. As illustrated, according to some embodiments, an arc mitigation device 100 having a form factor substantially the same as a circuit breaker 550 may be installed in the switchgear 500, instead of a circuit breaker. The switchgear 500 is shown with cutouts of various sizes to accommodate other electronic devices.

Figure 6A:
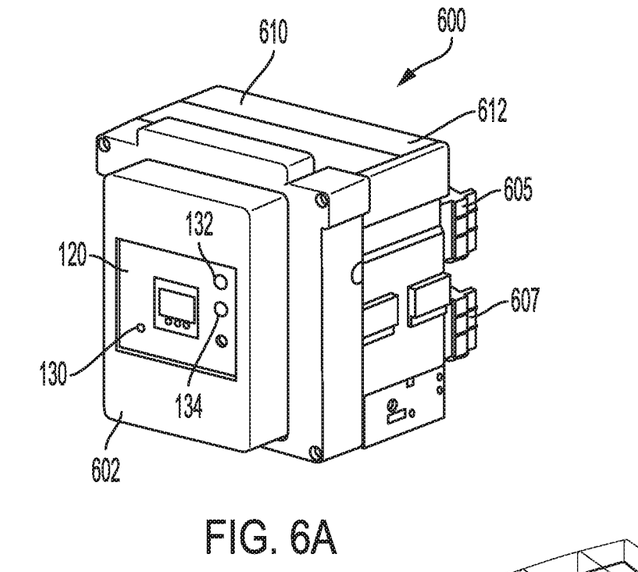
FIG. 6A illustrates a front perspective view of an arc flash mitigation device with a housing with an air circuit breaker (ACB) form factor.
Figures 6B, 7:
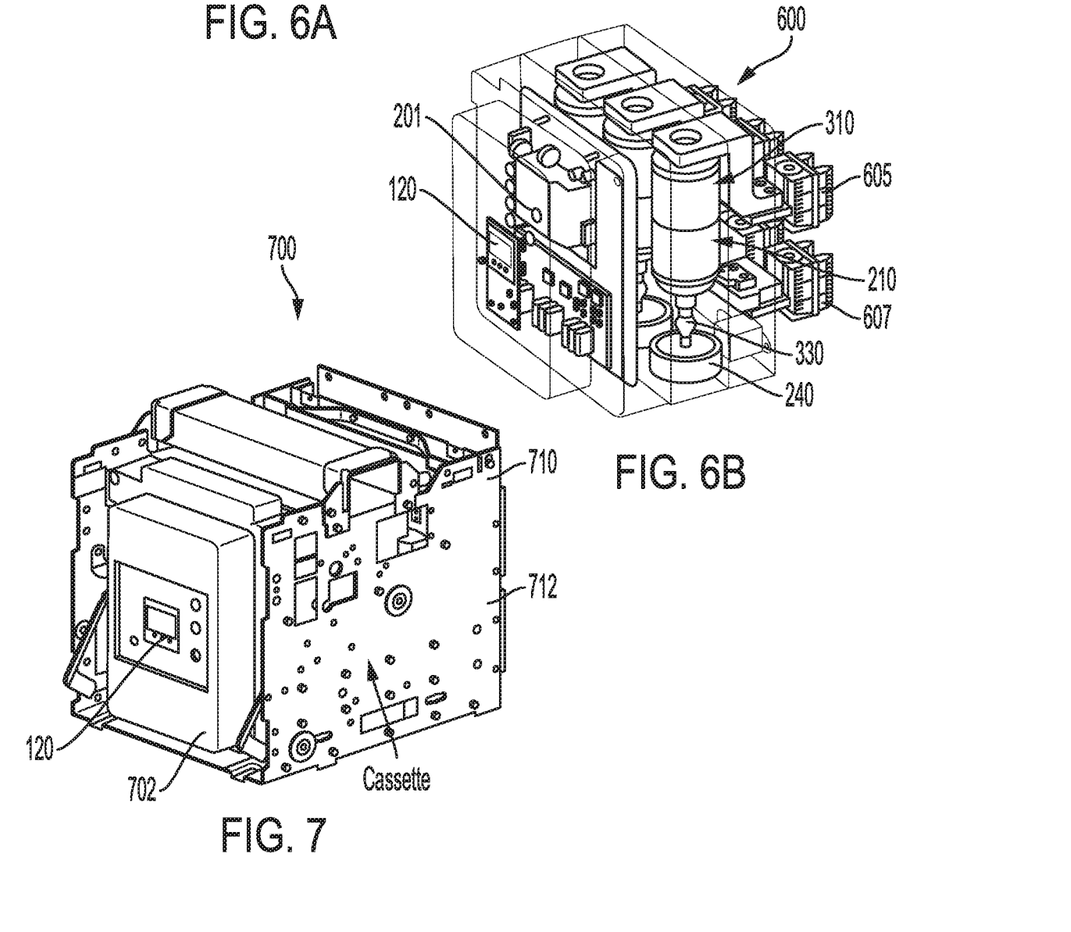
FIG. 6B illustrates a front perspective view of the arc flash mitigation device of FIG. 6A with a portion of the housing removed.
FIG. 7 illustrates a front perspective view of an arc flash mitigation device with a housing with a cassette form factor.

FIG. 6A illustrates a front perspective view of an arc flash mitigation device 600 with a housing with an air circuit breaker (ACB) form factor. Arc flash mitigation device 600 is the same, as arc flash mitigation device 100 except details of the form factor of housing 610 will be described. A front panel or cover 602 of the housing 610 may have mounted display panel 125, indicator 130 and control buttons 132 and 134 of the control panel 120 for easy access by personnel 20 (FIG. 1). Housing 610 may include a rear housing section 612 that is configured to be mated and attached to the front panel or cover 602. The rear housing section 612 may have mounted on a rear surface rear upper connectors 605 and rear lower connectors 607 for attaching housing 610 to bus bar connectors to conduct current from its line side to load side to downstream electrical equipment (FIG. 5), for example, or other electrical machine. FIG. 6B illustrates a front perspective view of the arc flash mitigation device 600 of FIG. 6A with a portion of the housing removed. The housing 610 may locate bi-directional bypass power switch device 201 of protection electronic circuitry 105 adjacent front panel 602 of housing 610. Electro-mechanical switching device 210 may include a vacuum interrupter 310 mechanically connected to a lower mounted ultra-fast actuator 240 via a linkage 330.

FIG. 7 illustrates a front perspective view of an arc flash mitigation device 700 with a housing with a cassette form factor. Arc flash mitigation device 700 is the same, as arc flash mitigation device 100 except details of the form factor of housing 710 will be described. A front panel or cover 702 of the housing 710 may have mounted display panel 125, indicator 130 and control buttons 132 and 134 of the control panel 120 for easy access by personnel 20 (FIG. 1). Housing 710 may include a rear housing section 712 that is configured to be mated and attached to the front panel or cover 702.

Figure 8:
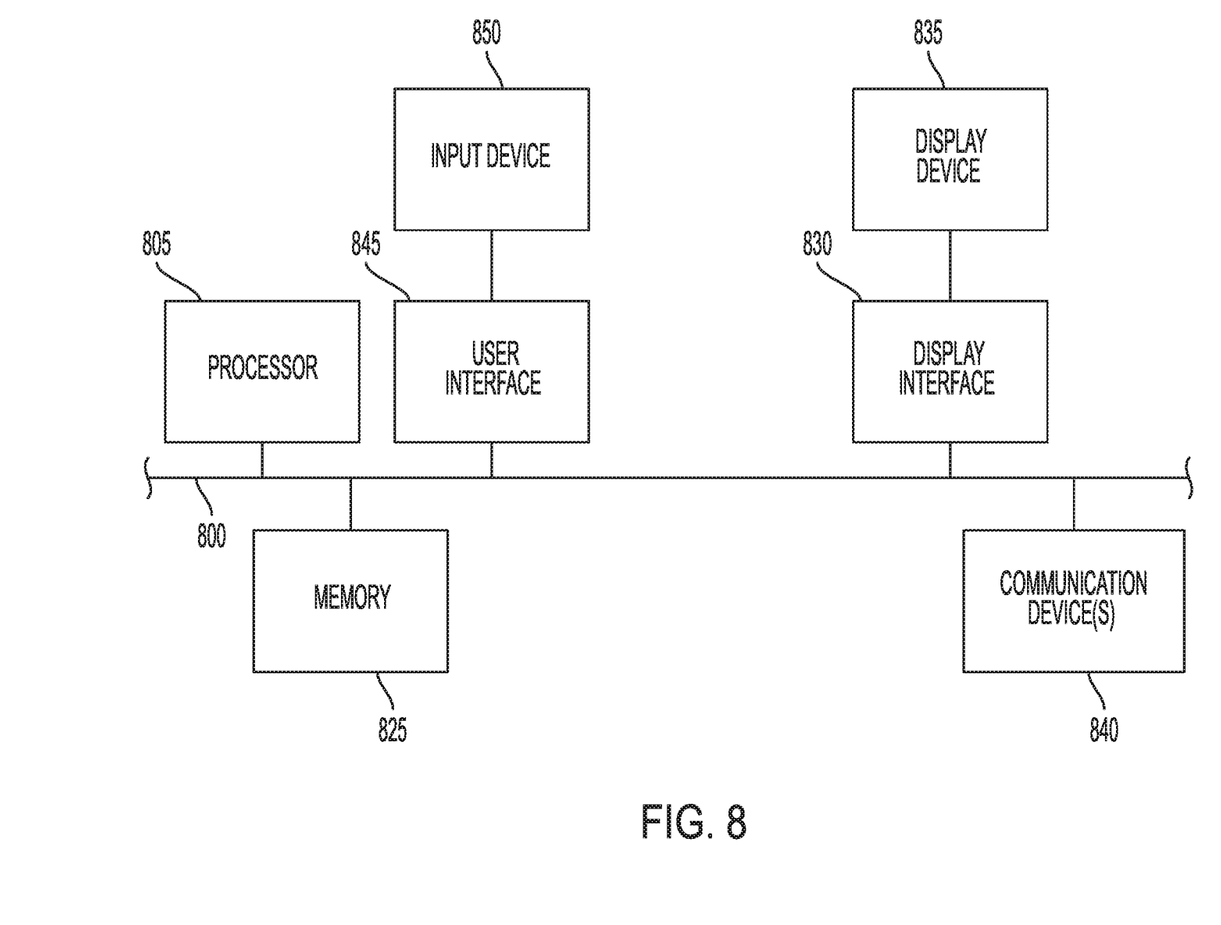
FIG. 8 depicts an example of internal hardware that may be included in any of the electronic components of the system, such as internal processing systems of computing devices, controllers and sensors.

FIG. 8 depicts an example of internal hardware that may be included in any of the electronic components of the system, such as controllers, sensors and computing devices. An electrical bus 800 serves as an information highway interconnecting the other illustrated components of the hardware. Processor 805 is a central processing device of the system, configured to perform calculations and logic operations required to execute programming instructions. As used in this document and in the claims, the terms "processor" and "processing device" may refer to a single processor or any number of processors in a set of processors that collectively perform a set of operations, such as a central processing unit (CPU), a remote server, or a combination of these. Read only memory (ROM), random access memory (RAM), flash memory, hard drives and other devices capable of storing electronic data constitute examples of memory devices 825. A memory device 825 may include a single device or a collection of devices across which data and/or instructions are stored. Various embodiments of the invention may include a computer-readable medium containing programming instructions that are configured to cause one or more processors, print devices and/or scanning devices to perform the functions described in the context of the previous figures.

An optional display interface 830 may permit information from bus 800 to be displayed on a display device 835 (i.e., control panel) in visual, graphic or alphanumeric format. An audio interface and audio output (such as a speaker) also may be provided. Communication with external devices may occur using various communication devices 840 such as a wireless antenna, a radio frequency identification (RFID) tag and/or short-range or near-field communication transceiver, each of which may optionally communicatively connect with other components of the device via one or more communication system. Communication device(s) 840 may be configured to be communicatively connected to a communications network, such as the Internet, a local area network or a cellular telephone data network.

The hardware may also include a user interface sensor 845 that allows for receipt of data from input devices 850 such as a keyboard or keypad, a joystick, a touchscreen, a touch pad, a remote control, control buttons, a pointing device and/or microphone. The above-disclosed features and functions, as well as alternatives, may be combined into many other different systems or applications. Various components may be implemented in hardware or software or embedded software. Various presently unforeseen or unanticipated alternatives, modifications, variations or improvements may be made by those skilled in the art, each of which is also intended to be encompassed by the disclosed embodiments.

Terminology that is relevant to the disclosure provided above includes:

The terms "memory" and "computer-readable medium" each refer to a non-transitory device on which computer-readable data, programming instructions or both are stored. Except where specifically stated otherwise, the terms "memory" and "computer-readable media" are intended to include single device embodiments, embodiments in which multiple memory devices together or collectively store a set of data or instructions, as well as individual sectors within such devices.

The terms "processor" and "processing device" refer to a hardware component of an electronic device that is configured to execute programming instructions. Except where specifically stated otherwise, the terms "memory" and "computer-readable medium" are intended to include single-processing device embodiments and embodiments in which multiple processing devices together or collectively perform a process.

In this document, the term "communication line" means a wired or wireless path via which a first device sends communication signals to and/or receives communication signals from one or more other devices. Devices are "communicatively connected" if the devices are able to send and/or receive data via a communication link. "Electronic communication" refers to the transmission of data via one or more signals between two or more electronic devices, whether through a wired or wireless network, and whether directly or indirectly via one or more intermediary devices.

In this document, when relative terms of order such as "first" and "second" are used to modify a noun, such use is simply intended to distinguish one item from another, and is not intended to require a sequential order unless specifically stated.

In addition, terms of relative position such as "vertical" and "horizontal", or "front" and "rear", when used, are intended to be relative to each other and need not be absolute, and only refer to one possible position of the device associated with those terms depending on the device's orientation. In addition, the terms "front" and "rear" are not necessarily limited to forward-facing or rear-facing areas but also include side areas that are closer to the front than the rear, or vice versa, respectively.

The invention claimed is:

1. A device comprising:
   an electro-mechanical switching device having an open-circuit condition and a closed-circuit condition;
   a path of least resistance having a path input and a path output with the electro-mechanical switching device between the path input and the path output;
   a bypass power switch device that comprises a solid-state circuit interrupter and that is configured to conduct current between the path input and the path output in response to an open-circuit condition of the electro-mechanical switching device;
   a current sensor that is connected to the path output, the current sensor is configured to detect a fault current event;
   an actuator that is coupled to the electro-mechanical switching device;
   a controller that is configured to generate a trigger signal to activate the actuator to cause the open-circuit condition of the electro-mechanical switching device and to interrupt the fault current event by the bypass power switch device, based on the detected fault current event; and
   an external control panel connected to a control panel input of the controller,
   wherein the external control panel is configured to provide a user interface to control operations of the controller, and
   wherein the controller is also configured to:
   in response to receiving a disarming control signal at the control panel input, cause in the path of least resistance the closed-circuit condition of the electro-mechanical switching device; and
   in response to receiving an arming control signal at the control panel input, cause in the path of least resistance the open-circuit condition of the electro-mechanical switching device.

2. The device of claim 1, wherein:
   the current sensor has an output that is connected to a sensor input of the controller; and
   the current sensor is configured to communicate a signal representative of detection of the fault current event to the sensor input of the controller.

3. The device of claim 1, wherein the solid-state circuit interrupter comprises:
   at least one transient-voltage suppression (TVS) diode having a first end connected to the path input and a second end connected to the path of least resistance between the electro-mechanical switching device and the path output; and
   a bi-directional transistor switch having a first connection connected to the first end and the path input and a second connection connected to the second end and the path output.

4. The device of claim 3, wherein the at least one TVS diode comprises parallel TVS diodes.

5. The device of claim 1, further comprising:
   a housing for housing the electro-mechanical switching device, the path of least resistance, the bypass power switch device and the controller,
   wherein the housing comprises a molded case circuit breaker or an air circuit breaker.

6. The device of claim 1, wherein:
the electro-mechanical switching device comprises a vacuum interrupter; and
the actuator comprises a Thompson coil or piezo-electric actuator connected to the vacuum interrupter.

7. The device of claim 1, wherein the bypass power switch device also comprises a cooling device.

8. The device of claim 7, wherein the detected fault current event comprises a current associated with an arc flash event.

9. A method comprising:
controlling, in a path of least resistance including a path input and a path output, an electro-mechanical switching device that is between the path input and the path output;
detecting, by a current sensor, a fault current event at the path output;
generating, by a controller, a trigger signal to activate an actuator coupled to the electro-mechanical switching device;
causing an open-circuit condition of the electro-mechanical switching device in the path of least resistance, in response to the activation of the actuator;
interrupting the detected fault current event by a bypass power switch device that comprises a solid-state circuit interrupter connected to the path input and the path output, in response to the open-circuit condition; and
controlling, by an external control panel connected to a control panel input of the controller, operations of the controller,
wherein the controlling comprises:
in response to a disarming control signal received at the control panel input of the controller, causing a closed-circuit condition of the electro-mechanical switching device from the path input to the path output; and
in response to an arming control signal received at the control panel input of the controller, causing the open-circuit condition of the electro-mechanical switching device.

10. The method of claim 9, wherein the fault current event comprises an arc flash event that occurred downstream the path output.

11. The method of claim 9, wherein the interrupting by the bypass power switch device comprises:
passing the fault current event to at least one transient-voltage suppression (TVS) diode of the solid-state circuit interrupter connected to the path of least resistance between the electro-mechanical switching device and the path output, to suppress a transient voltage.

12. The method of claim 11, wherein the at least one TVS diode comprises parallel TVS diodes.

13. The method of claim 9, wherein:
the electro-mechanical switching device comprises a vacuum interrupter with a vacuum chamber and an electro-mechanical switching device within the vacuum chamber; and
the actuator comprises a Thompson coil or piezo-electric actuator connected to the vacuum interrupter.

14. The method of claim 13, wherein:
the bypass power switch device comprises a cooling device; and
the method further comprises cooling the bypass power switch device by the cooling device.

15. The method of claim 9, wherein the detected fault current event is an arc flash event.

16. The method of claim 15, wherein the bypass power switch device has a response time between 100 microseconds and 0.5 milliseconds to interrupt the detected fault current event.

* * * * *